United States Patent [19]

Ohbuchi et al.

[11] Patent Number: 5,719,746
[45] Date of Patent: Feb. 17, 1998

[54] IC CARD

[75] Inventors: Jun Ohbuchi; Shigeo Onoda; Katsunori Ochi; Makoto Omori; Tetsuro Washida; Kiyotaka Nishino, all of Tokyo, Japan

[73] Assignee: Mitsubishi Denki Kabushiki Kaisha, Tokyo, Japan

[21] Appl. No.: 587,928

[22] Filed: Jan. 17, 1996

[30] Foreign Application Priority Data

Aug. 18, 1995 [JP] Japan .................. 7-210591

[51] Int. Cl.⁶ .................................. H05K 1/14
[52] U.S. Cl. .............. 361/737; 220/402; 206/706; 361/752
[58] Field of Search .................. 361/737, 752, 361/820; 206/706–707, 709; 235/488–489, 492; 220/4.02, 4.21; 343/872, 700 MS; 174/52.2, 52.3, 52.4, 52.6

[56] References Cited

U.S. PATENT DOCUMENTS

| | | | |
|---|---|---|---|
| 4,798,946 | 1/1989 | Fujii et al. | 361/737 |
| 5,461,256 | 10/1995 | Yamada et al. | 257/679 |

*Primary Examiner*—Michael W. Phillips
*Assistant Examiner*—Phuong T. Vu

[57] ABSTRACT

An IC card comprises a module with an electric circuit and two panels adhered to each other to cover the module between them. The two panels are adhered with an adhesive with a sufficient adhesion strength and seals the module with no path of air to the outside of the IC card. Airtight sealing of the IC card in realized in various ways. For example, a groove having a varying width is provided in one of the panels for applying an adhesive, while a groove engaging to the groove is provided in the other of the panels. When the two panels are adhered to each other, gas channels may be formed in the groove at portions with narrower widths, while an adhesive in the groove at portions with wider widths fills the gas channels due to viscosity. In another way, a protrusion provided in one of the panels has an edge opposite to a groove provided in the other of the panels. Thus, the groove is kept air-tight. In a different way, an adhesive having a high viscosity at curing temperature is used. In a still different way, all the space inside the IC card is filled, or a sufficient amount of an adhesive is filled in a space between the two panels around a peripheral thereof. In a further way, the panels are adhered in a thermostat. In a still further way, the panels are adhered with melting at a peripheral thereof.

13 Claims, 8 Drawing Sheets

IC CARD

BACKGROUND OF THE INVENTION

1. Field of the Invention

The present invention relates to an IC card and a fabrication method therefor, in particular to an IC card which transmits data with electromagnetic waves and a fabrication method therefor.

2. Description of the Prior Art

An IC card includes a module constructing an electric circuit including integrated circuits and electronics parts. The module is arranged in an internal space between base and cover panel members. An IC card used for example in a ski resort transmits data with electromagnetic waves. Such an IC card is fabricated so that the two panel members are connected to each other with an adhesive along the whole peripheral thereof to keep the IC card airtight.

When such an IC card is fabricated, the two panel members are combined with each other with a thermosetting adhesive agent applied between them and the adhesive agent is cured by heating. Thus, the inside of the IC card is shielded by the adhesive agent. However, when the two panel members combined with an adhesive agent are put in a thermostat, the gas inside the IC card expands and presses the gas inside the IC card towards the outside. As a result, an actual adhesion area becomes narrower than required, and this weakens the mechanical strength of the IC card or the panel members may separate from each other.

Further, portions not adhered between the two panel members are liable to occur, and if such portions exist, the IC card is exposed to ambient environment through these portions, and moisture or water permeates inside the IC card, and this corrodes the module causing malfunctions.

SUMMARY OF THE INVENTION

An object of the present invention is to provide an IC card having a sufficient adhesion strength and a fabrication method therefor.

Another object of the present invention is to provide an IC card having airtight adhesion with no leak paths to the outside thereof and a fabrication method therefor.

An IC card comprises a first panel member, a second panel member and a module constructing an electric circuit arranged between the two panel members. The IC card is kept airtight in various ways. In one aspect of the invention, the first panel member has a groove along a periphery thereof, while a second panel member has a protrusion to engage with the groove of said first panel member. The groove has a distribution of width (preferably portions of a narrower width and portions of a wider width arranged alternately). Thus, spaces are left between an inner peripheral of the groove of the first panel member and the protrusion of the second panel member. Then, when the IC card is fabricated by heating a thermosetting adhesive agent between the groove and the protrusions, the adhesive can remain in the spaces while fills passages of expanded gas in the inner space of the IC card due to viscosity.

In a second aspect of the invention, a first panel member has a groove, while a second panel member has a protrusion to engage with the groove of the first panel member, the protrusion having an edge along the whole groove, the edge making contact with a bottom of the groove of the first panel member when the groove is engaged with an adhesive agent with the protrusion. The edge makes close contact with the bottom of the groove, and the inner space in the IC card is kept airtight.

In a third aspect of the invention, an adhesion agent fills all the inner space between the first panel member and the second panel member. Because there is no gas in the inner space, there is no adverse influence of the gas on curing the adhesive agent.

In a fourth aspect of the invention, an adhesion member applied between the groove of the first panel member and the protrusion of the second panel member is made of an acrylic adhesive agent having a viscosity larger than or equal to $10^8$ cp. Then, even if the temperature of the adhesion member is increased, the adhesion member does not move from the groove towards the outside.

In a fifth aspect of the invention, when an IC card is fabricated, a thermosetting adhesive is applied to an outer portion on the first panel member so as to occupy the inner space at a ratio equal to or larger than $(T_1/T_0-1)$ of volume, wherein $T_1$ denotes an absolute temperature in the thermostat and $T_0$ denotes absolute room temperature. Then, the combined first and second panel members is put in a thermostat to cure the adhesive agent, the adhesive agent remains in the groove, and the IC card is kept airtight.

In a sixth aspect of the invention, a first panel member with an adhesive agent applied is put first in a thermostat. Then, the first panel member is combined with a second panel member in the thermostat. Then, there is no pressure difference between the inner space of the IC card and the outside when the adhesive agent is cured.

In a seventh aspect of the invention, after mounting a module constructing an electric circuit on a first panel, the first panel member is combined with a second panel member with a contact plane between them. Then, the first and second panel members are heated along the whole peripheral thereof to melt the first and second panel members at the contact plane. Thus, the two panel members are adhered without expanding the gas in the inner space.

An advantage of the present invention is that the IC card has a sufficient mechanical strength because the adhesion area has a prescribed value.

Another advantage of the present invention is that the IC card does not cause a malfunction due to water penetration in to the inside of the IC card.

BRIEF DESCRIPTION OF THE DRAWINGS

These and other objects and features of the present invention will become clear from the following description taken in conjunction with the preferred embodiments thereof with reference to the accompanying drawings, and in which.

DETAILED DESCRIPTION OF THE PREFERRED EMBODIMENTS

Figure 1:
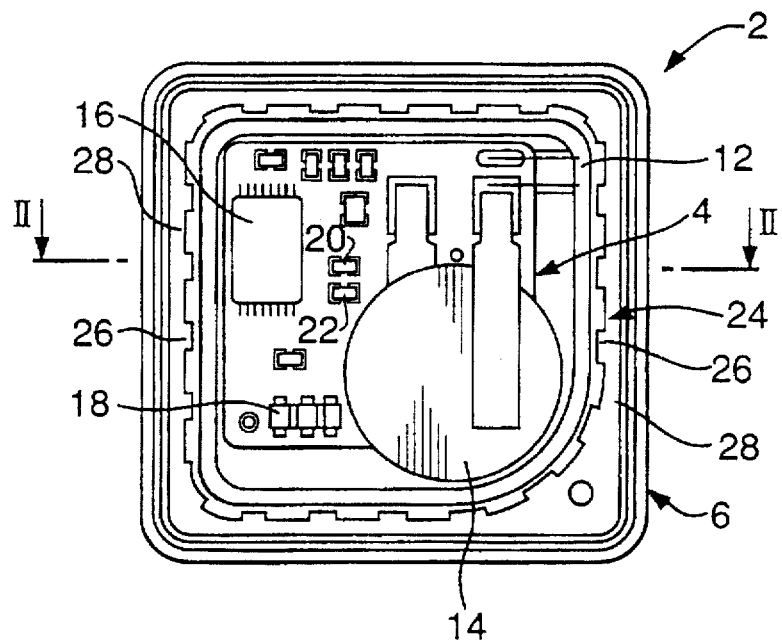
FIG. 1 is a plan view of an IC card of a first embodiment of the invention with a cover removed.
Figure 2:
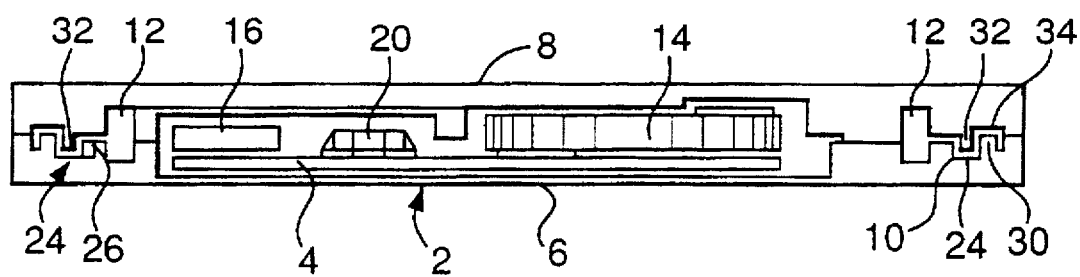
FIG. 2 is a sectional view of the IC card along A—A line in FIG. 1.

Referring now to the drawings, wherein like reference characters designate like or corresponding parts throughout the drawings, FIGS. 1 and 2 show an IC card 2 of a first embodiment of the invention. As shown in FIG. 2, the IC card includes a module 4 constructing an electric circuit, a base 6 and a cover 8. The base 6 and the cover 8 are made with resin, and they are integrated to form a panel. They are adhered with an adhesive agent 10 along an entire periphery thereof and includes the module 4 in an internal space formed between them. A coil 12 (only a groove therefor is shown in FIGS. 1 and 2) for receiving data are arranged between the base 6 and the cover 8.

FIG. 1 shows the IC card 2 in a state with its cover 8 removed. The module 4 includes an electric circuit constructed by mounting, for example, a cell 14, an integrated circuit 16, a ceramic oscillator 18, a capacitor 20 and a resistor 22. The base 6 has a groove 24 for applying a liquid adhesive agent 10 outside the groove for the coil 12. The groove 24 is located continuously along the outer peripheral of the base 6. It is a feature that the groove 24 has a width which is not uniform, including portions 26 having a wider width than the remaining portions at prescribed intervals along the whole groove 24. In the example shown in FIG. 1, the portions 26 having a wider width and portions 28 having a narrower width are provided alternately at equal intervals. The portions 26 and 28 are also provided at the four corners of the base 6 though the widths are different from the counterparts along the four sides thereof. Further, a protrusion 30 is provided outside the groove 24. On the other hand, the cover has a protrusion 32 to be engaged with the groove 24 of the base 6 and a recess 34 in correspondence to the protrusion 30 of the base 6. The protrusion 32 has a width in correspondence to the width of the portions 26 having the narrower width, and there remain spaces between the inner circumference of the portions 28 and the protrusion 32 when the groove 24 is engaged with the protrusion 32.

Figure 3:
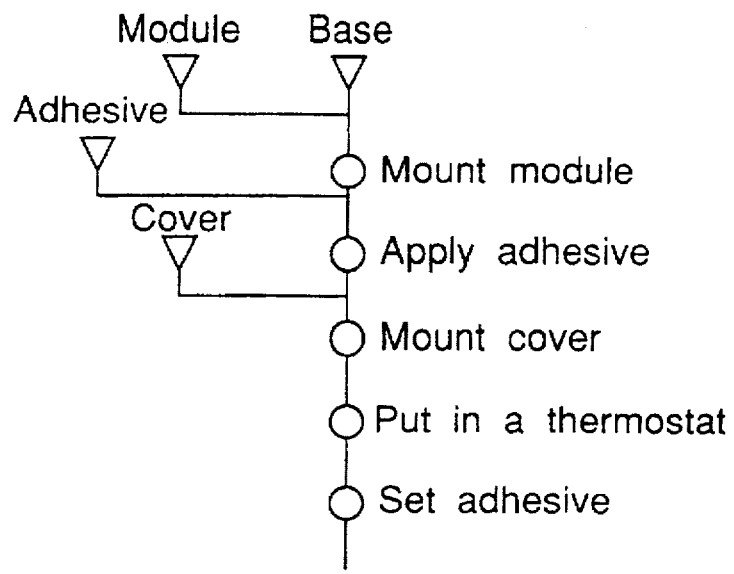
FIG. 3 is a flowchart of fabrication of the IC card.

Next, fabrication of the IC card 2 is explained with reference to FIG. 3. First, the module 4 and the base 6 are provided. Next, the module 4 and the coil 12 are mounted to the base 6. Then, the cover 8 is provided, while the adhesive agent 10 is applied to the groove 24 of the base 6 and the protrusion 32 of the cover 8. Next, the groove 24 of the base 6 is engaged with the protrusion 32 of the cover 8, to mount the cover 8 to the base 6. Then, the combined unit is put into a thermostat, and the temperature in the thermostat is increased to set the adhesive agent.

Figure 4:
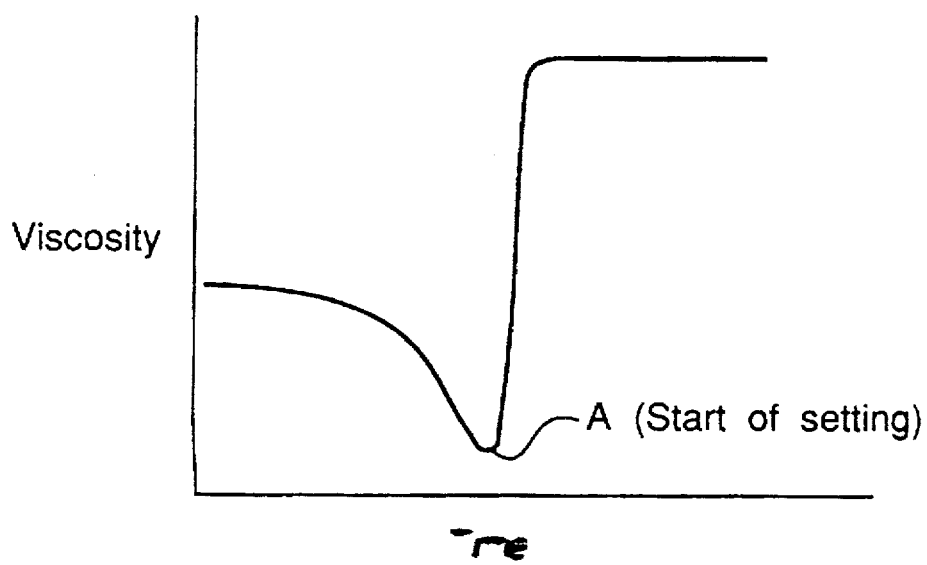
FIG. 4 is a graph of temperature dependence of viscosity on curing.

FIG. 4 shows the time dependence of the viscosity of the adhesive agent 10 after the combined unit is put into the thermostat or in an environment to cure the adhesive agent. The viscosity increases with increasing temperature gradually. When the temperature exceeds the setting temperature of the adhesive agent, the viscosity starts to increase sharply and the adhesive agent becomes a solid or rubber-like material.

In the fabrication of the IC card, when the combined unit is put in the thermostat, gas inside the IC card 2 expands due to temperature increase, and it leaks through the groove 24 to the external. Passages or leakage paths of the gas are likely to be formed at the portions 28 having a narrower width (except the portions 26 storing the excess adhesive agent 10) because the width of the groove 24 has a distribution. Then, there is no pressure difference between the inside and the outside of the IC card. On the other hand, a large amount of the adhesive agent gathers in spaces between the inner circumference of the portions 28 and the protrusion 32. After the passages are formed, the adhesive agent gathering in the portions 26 flows into the passages to fill the passages due to its viscosity. A proper amount of the adhesive agent 10 is needed to serve this function. Then, the adhesive agent 10 is cured or solidified in a state where there is no pressure difference between the inside and the outside of the IC card 2.

As explained above, because the groove 24 has a distribution of width, passages are formed deliberately between the inside and the outside of the IC card, there is no pressure difference on curing, and no adhesive agent flows outside. Further, the portions 26 having a wider width serves as a source for supplying the adhesive agent to the passage. Therefore, a desired adhesive area can be obtained. Then, because no water or moisture leaks into the inside, no malfunction of the IC card 2 occurs.

Figure 5:
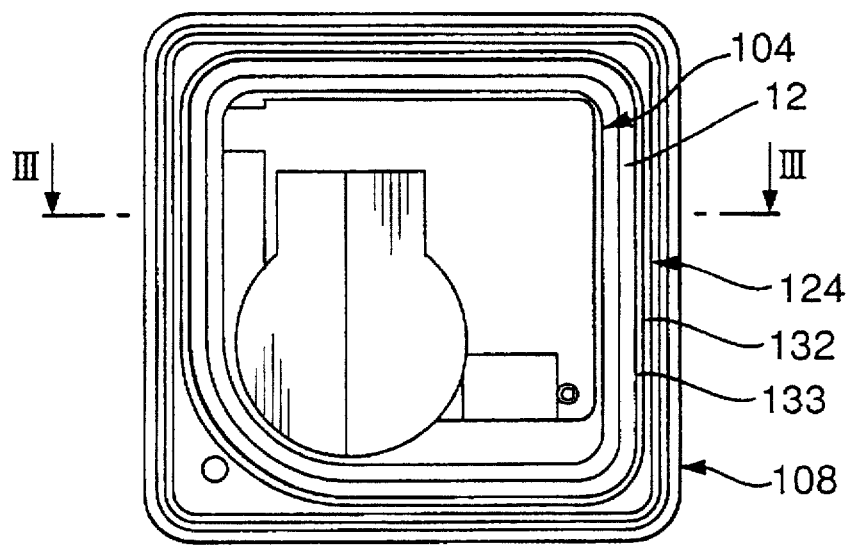
FIG. 5 is a plan view of an IC card of a second embodiment of the invention with a base removed.
Figure 6:
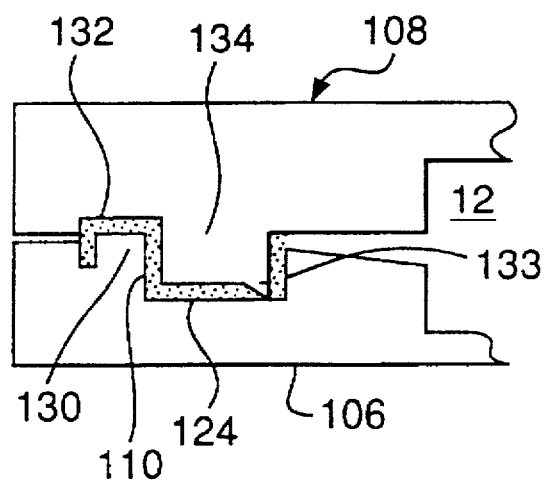
FIG. 6 is a partial sectional view of the IC card along B—B line in FIG. 5.

FIGS. 5 and 6 shows an IC card 102 of a second embodiment of the invention. As shown in FIG. 6, the IC card 102 comprises a module 4 constructing an electric circuit, a base 106 and a cover 108, similar to the IC card 2 of the first embodiment. The base 106 and the cover 108 are made with resin, and they are integrated to form a panel. They are adhered with an adhesive agent 110 along an entire periphery thereof and include the module 4 in an internal space formed between them. A coil 12 (only a groove therefor is shown in FIG. 5) for receiving data is arranged between the base 106 and the cover 108. The base 106 is different from the base 6 of the first embodiment in that the groove 124 for applying the adhesive agent 110 has a uniform width along the whole circumference and that the cover 108 has a protrusion 134 with an edge 133.

When the base 106 is combined with the cover 108 by applying the adhesive agent 110 at the groove 124 and the protrusion 134, the edge 133 of the protrusion 134 engages with the groove 124 to keep the space between the base 106 and the protrusion 108 airtight. Therefore, when the combined unit of the cover 108 and the base 106 is put in a thermostat for curing, the edge 133 makes contact closely with the groove 124 and the expansion of the gas is suppressed by the edge 133, and no adhesive agent flows out through the space between the edge 133 and the groove 124. Therefore, a desired adhesive area can be obtained. Then, because no water or moisture leaks into the inside, no malfunction of the IC card 102 occurs.

Figure 7:
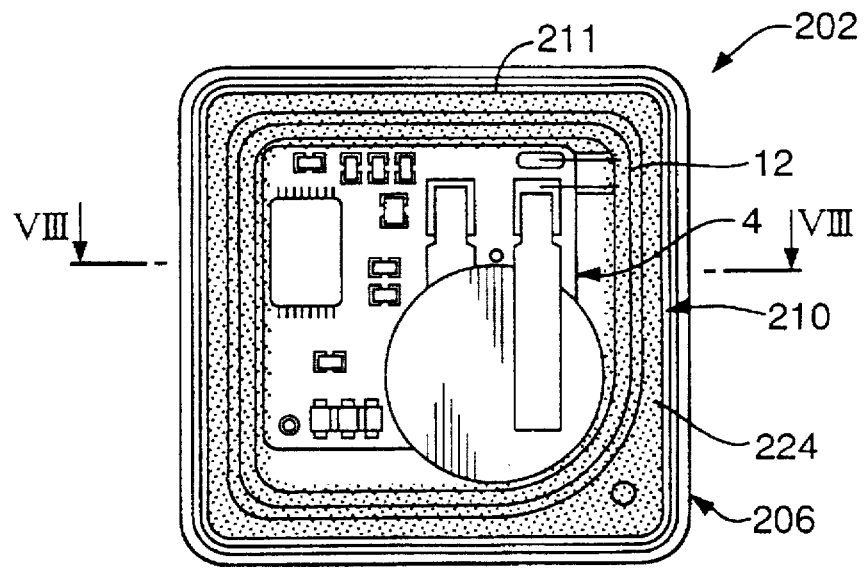
FIG. 7 is a plan view of an IC card of a third embodiment of the invention with a cover removed.
Figure 8:
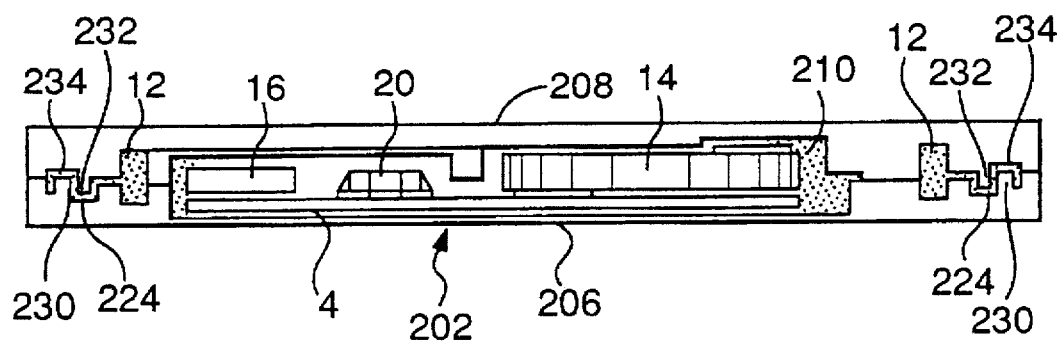
FIG. 8 is a sectional view of the IC card along C—C line in FIG. 7.

FIGS. 7 and 8 show an IC card 202 of a third embodiment of the invention. As shown in FIG. 8, the IC card 202 comprises a module 4 constructing an electric circuit, a base 206 and a cover 208, similar to the IC card 2 of the first embodiment. The base 206 and the cover 208 is made with resin, and they are integrated to form a panel. They are adhered with an adhesive agent 210 along periphery thereof and includes the module 4 in an internal space formed between them. A coil 12 (only a groove therefor is shown in FIG. 8) for receiving data are arranged between the base 206 and the cover 208. The base 206 is different from the base 6 of the first embodiment in that the groove 224 for applying an adhesive agent 110 has a uniform width along the whole circumference and that the cover 208 has a protrusion 232 in correspondence to the groove 224.

In FIG. 7, the adhesive 210 are applied in a region 211 illustrated with dots. The region 211 has a volume equal to or larger than a ratio of $(T_1/T_0-1)$ of the whole internal space $V_0$ between the base 206 and the cover 208, wherein $T_1$ denotes an absolute temperature in the thermostat and $T_0$ denotes absolute room temperature. The region 211 is explained further. According to the equation of state of ideal gas, $$pV=nRT, \quad (1)$$

where p denotes pressure, V denotes volume, n denotes a mol number, R denotes gas constant and T denotes temperature expressed in the unit of absolute temperature, $$pV_1=nRT_1, \quad (2)$$

where $V_1$ denotes the volume of the gas in the inner space between the base 206 on curing and the cover 208 and $T_1$ denotes the curing temperature. Then, the following relation holds:

$$V_1T_1=V_0T_0=nR/p, \quad (3)$$

where $V_0$ denotes the volume of the gas in the inner space between the base 206 at room temperature and the cover 208 and $T_1$ denotes room temperature. Therefore, $$V_0=(T_0/T_1)V_1. \quad (4)$$

That is, the volume change depends of a temperature ratio $T_0/T_1$.

When the IC card 202 is fabricated, the adhesive agent 210 is applied in the region 211 to enclose a gas in the inner space in the IC card 202 so that the volume $V_1$ on the curing temperature T, is smaller than the whole inner space enclosed by the base 206 and the cover 208. Then, though the gas expands by heating and presses the adhesive agent 210 to the outside, it does not go out from the inner space, or the adhesive agent exists in the groove 224 for strong adhesion A lower limit of the adhesive agent 210 applied in the region 211 is given by a following relation:

$$V_1-V_0=(T_1/T_0-1)V_0. \quad (5)$$

In a fabrication process, the adhesive agent 210 is applied in the peripheral region 211 on the base 206 to enclose a gas in the inner space in the IC card 202, and it occupies a volume equal to or larger than a ratio of $(T_1/T_0-1)$ of the whole internal space $V_0$ between the base 206 and the cover 208. Then, the base 206 is combined with the cover 208 so as to engage the groove 224, a desired adhesive area can be obtained with the protrusion 232, and the combined unit is put in a thermostat. Then, the gas in the inner space expands due to the temperature difference at the inner space, but the adhesive agent 210 remains in the groove 224 on curing. Therefore, there occurs no passage of gas at the groove 224, and a desired adhesive area can be obtained. Then, because no water or moisture leaks into the inside, no malfunction of the IC card 202 occurs.

Figure 9:
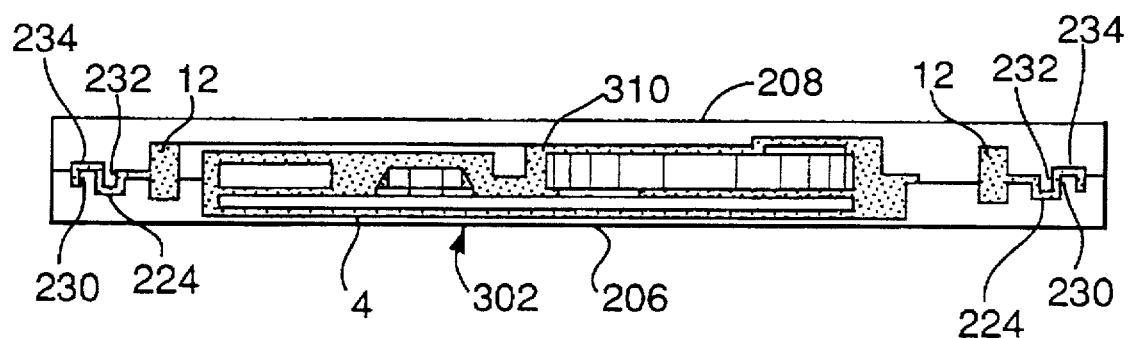
FIG. 9 is a sectional view of an IC card of a fourth embodiment of the invention.

FIG. 9 shows an IC card 302 of a fourth embodiment of the invention. The IC card 302 is the same as the IC card 202 of the third embodiment except that an adhesive agent 310 fills all the inner space between a base 306 and a cover 308. When the IC card 302 is fabricated, after the adhesive agent 310 (illustrated with dots in FIG. 9) fills all the inner space so as to exclude all the gas in the inner space, a combined unit of the base 306 and the cover 308 is put in a thermostat for curing the adhesive agent 310.

There is no gas in the inner space. Therefore, no gas expansion occurs in the inner space on curing or the adhesive agent 310 is not pressed towards the outside, so that a desired adhesive area can be obtained. Then, because no water or moisture leaks into the inside, no malfunction of the IC card 302 occurs.

Figure 10:
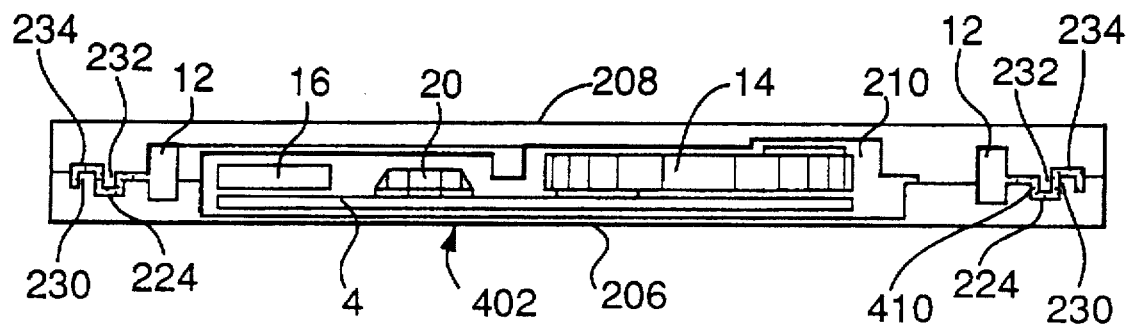
FIG. 10 is a sectional view of an IC card of a fifth embodiment of the invention.
Figure 11:
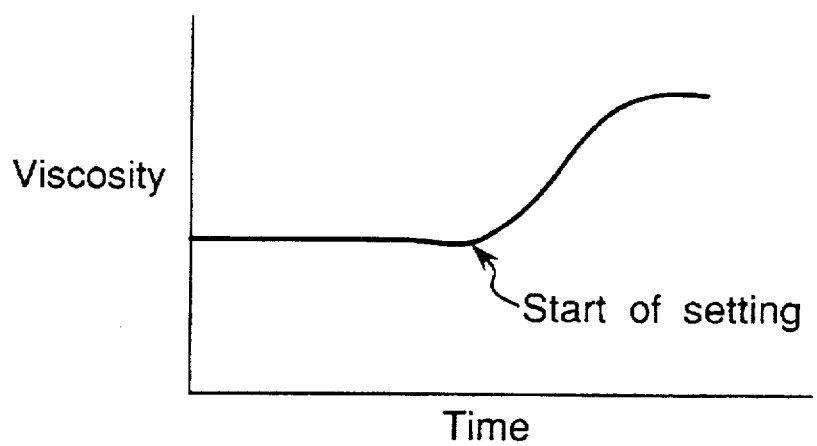
FIG. 11 is a graph of temperature dependence of viscosity on curing.

FIG. 10 shows an IC card 402 of a fifth embodiment of the invention. The IC card 402 is the same as the IC card 202 of the third embodiment except an adhesive agent 410 provided between a groove 224 of a base 206 and a protrusion 232 of a cover 208. The adhesive agent 410 includes an acrylic adhesive agent having a viscosity equal to or larger than $10_8$ cp. Therefore, the adhesive agent 410 does not flow even when the pressure in the inner space of the IC card 402 increases due to a temperature increase during curing. FIG. 11 shows an example of the viscosity characteristic of an epoxy acrylic adhesive agent. The viscosity is kept the same after a combined unit of the base 206 with the cover 208 is put in a thermostat. When curing starts, the viscosity increases, and the adhesive agent 410 becomes a solid or a rubber-like material. Then, no gas expansion occurs in the inner space on curing or the adhesive agent 410 remains in the groove 224, so that a desired adhesive area can be obtained. Then, because no water or moisture leaks into the inside, no malfunction of the IC card 402 occurs.

Figure 12:
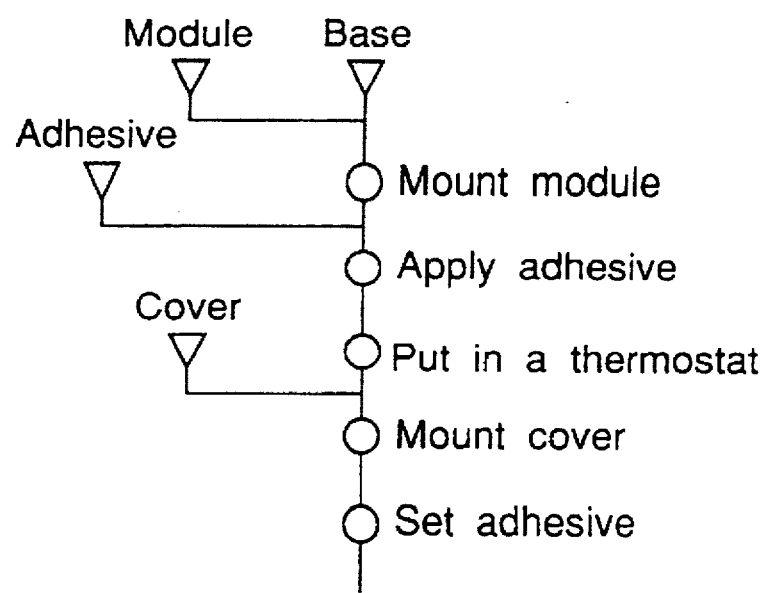
FIG. 12 is a flowchart of fabrication of the IC card.

Next, a fabrication method of a sixth embodiment of the invention is explained with reference to FIG. 12. The IC card to be fabricated is the same as that 202 of the third embodiment (FIGS. 7 and 8) except an amount of the adhesive agent 210. First, the module 4 (including the coil 12) and the base 206 are provided. Next, the module 4 and the coil 12 is mounted to the base 206. Then, before the cover 208 is mounted, the adhesive agent 210 is applied to the groove 224 of the base 206. Next, the cover 208 is provided, while the base 206 is put in an curing environment in a thermostat, and the groove 224 of the base 206 is engaged with the protrusion 230 of the cover 208, to combine the base 206 with the cover 208. Because there is no temperature difference between the inside and the outside of the inner space between the base 206 and the cover 208, when the cover 208, is mounted to the base 206, no gas expansion occurs, or the adhesive agent 210 is not pressed towards the outside. Then, the adhesive agent 210 is set, and a desired adhesive area can be obtained.

Figure 13:
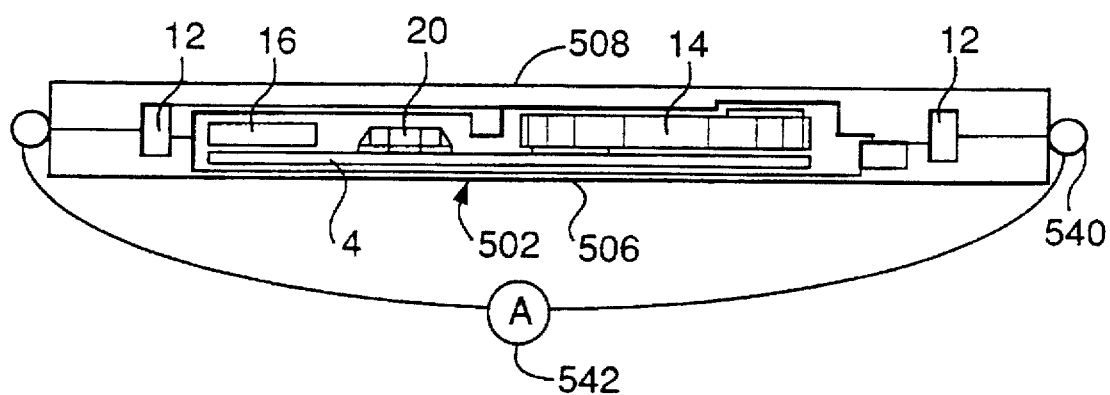
FIG. 13 is a sectional view of an IC card in a process for fabricating it.
Figure 14:
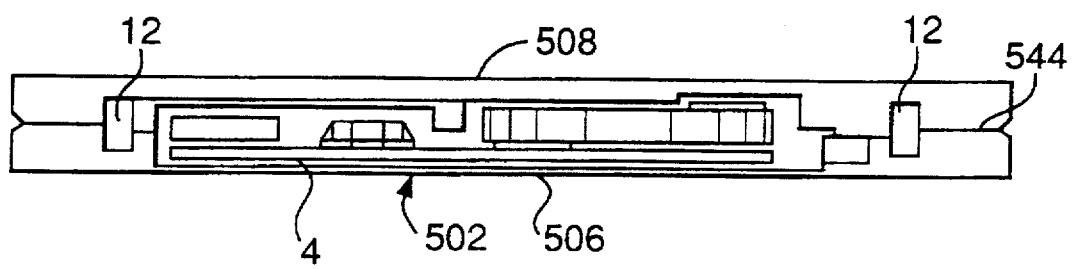
FIG. 14 is a sectional view of an IC card of a seventh embodiment of the invention.
Figure 15:
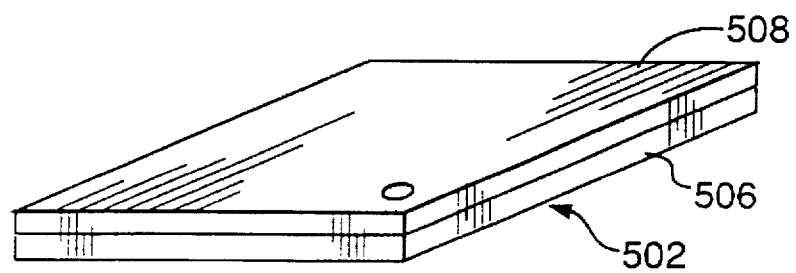
FIG. 15 is a perspective view of an IC card of the seventh embodiment of the invention.

FIGS. 13 and 14 shows an IC card 502 of a seventh embodiment of the invention. The IC card 502 is similar to the IC card 202 (FIGS. 7 and 8) of the third embodiment except that no adhesive agent is used. Because no adhesive agent is used, a base 506 and a cover 508 do not have the groove 224 for applying an adhesive agent, the protrusion 230 to be engaged with the groove 224, the protrusion 232 and the groove 234. On the other hand, the base 506 and the cover 508 have a contact plane between them at least at and near a side of the IC card, and they are adhered at the contact plane. The IC card 502 comprises a module 4 constructing an electric circuit, a base 506 and a cover 508. The base 506 and the cover 508 are made with resin, and they are integrated to form a panel. In the fabrication of the IC card 502, after the module 6 and the coil 12 are mounted to the base 506 and the cover 508 is combined with the base 506, a heater 540 is wound along an adhesion line at the outer periphery of the contact plane between the base 506 and the cover 508 of the combined unit. A power supply 542 is connected to the heater 540, and an electric current is supplied to the heater 540 to increase the temperature of at the adhesion line up to a melting temperature of the base 506 and the cover 508. Then, a melted section 744 is formed along the whole circumference to close the inner space between the base 506 and the cover 508. FIG. 15 shows a perspective view of the completed IC card.

Because the entire IC card 502 is not heated in the above-mentioned fabrication method, the gas inside the inner space does not expand and a desired adhesive area can be obtained. Because no water or moisture leaks into the inside, no malfunction of the IC card 402 occurs.

Figure 16:
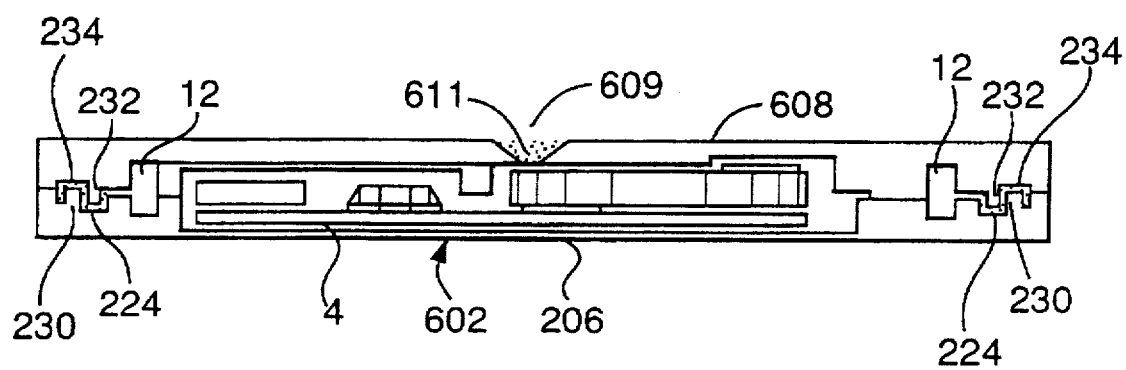
FIG. 16 is a sectional view of an embodiment of an IC card.

FIG. 16 shows another IC card 602 closing the inner space. The IC card 602 is the same as the IC card 202 of the third embodiment (FIGS. 7 and 8) except a cover 608 having a throughhole 609 as a vent hole. The IC card 602 comprises a module 4 constructing an electric circuit, a base 206 and a cover 608. The base 206 and the cover 608 are made with resin, and they are integrated to form a panel. In the fabrication of the IC card 602, after the module 6 and the coil 12 are mounted to the base 206, the cover 608 is combined with the base 206 with an adhesive agent 210 applied at a groove 224. Then, the combined unit is put in a thermostat for curing the adhesive agent 210. After the curing of the adhesive agent 210, the combined unit is put in an ambient environment, and the hole 609 is filled with a sealant 611 such as a silicone rubber which will sets at room temperature. On curing, the expanded gas leaks through the hole 609, and the adhesive agent 210 is not pressed towards the outside so that a desired adhesive area can be obtained. Because the hole 609 is sealed after curing, no water or moisture enters into the IC card 602, and no malfunction of the IC card 302 occurs.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An IC card comprising:
   a first panel member having a groove along a periphery thereof, the groove having a non-uniform width distribution;
   a second panel member having a protrusion to engage the groove of said first panel member, wherein spaces are formed between an inner periphery of the groove of said first panel member and the protrusion of said second panel member;
   a module arranged in an internal space between said first and second panel members; and
   an adhesion member cured between the groove of said first panel member and the protrusion of said second panel member.

2. The IC card of claim 1, wherein the groove having the varying width distribution, the adhesion member, and the protrusion interact to fully adhere said first panel member to said second panel member.

3. The IC card of claim 1, wherein the groove having the varying width distribution, the adhesion member, and the protrusion interact to prevent pressure build-up inside said IC card.

4. The IC card of claim 1, wherein the groove having the varying width distribution, the adhesion member, and the protrusion interact to provide an airtight bond between said first panel member and said second panel member.

5. An IC card comprising:
   a first panel member having a groove along a periphery thereof, the groove having a width distribution;
   a second panel member having a protrusion to engage the groove of said first panel member, wherein spaces are formed between an inner periphery of the groove of said first panel member and the protrusion of said second panel member;
   a module arranged in an internal space between said first and second panel members; and
   an adhesion member cured between the groove of said first panel member and the protrusion of said second panel member;
   wherein the groove of said first panel member includes first sections having a first width and second sections having a second width, wider than the first sections, the first sections and the second sections being arranged alternately.

6. The IC card of claim 5, wherein the groove having the varying width distribution, the adhesion member, and the protrusion interact to fully adhere said first panel member to said second panel member.

7. The IC card of claim 5, wherein the groove having the varying width distribution, the adhesion member, and the protrusion interact to prevent pressure build-up inside said IC card.

8. The IC card of claim 5, wherein the groove having the varying width distribution, the adhesion member, and the protrusion interact to provide an airtight bond between said first panel member and said second panel member.

9. An IC card comprising:
   a first panel member having a groove along a periphery thereof;
   a second panel member having a protrusion to engage the groove of said first panel member, the protrusion including an edge making linear contact with a bottom of the groove of said first panel member along an entire length of the groove;
   a module arranged in an internal space between said first and second panel members; and
   an adhesion member cured between the groove of said first panel member and the protrusion of said second panel member.

10. The IC card of claim 9, wherein the protrusion is triangular in shape.

11. The IC card of claim 9, wherein the groove having the varying width distribution, the adhesion member, and the protrusion interact to fully adhere said first panel member to said second panel member.

12. The IC card of claim 9, wherein the groove having the varying width distribution, the adhesion member, and the protrusion interact to suppress expansion of a gas inside said IC card.

13. The IC card of claim 9, wherein the groove having the varying width distribution, the adhesion member, and the protrusion interact to provide an airtight bond between said first panel member and said second panel member.

* * * * *